United States Patent [19]

Rando

[11] Patent Number: 5,617,202
[45] Date of Patent: *Apr. 1, 1997

[54] DIODE LASER CO-LINEAR AND INTERSECTING LIGHT BEAM GENERATOR

[75] Inventor: Joseph F. Rando, Los Altos Hills, Calif.

[73] Assignee: Levelite Technology, Inc., Mountain View, Calif.

[*] Notice: The term of this patent shall not extend beyond the expiration date of Pat. No. 5,500,524.

[21] Appl. No.: 482,732

[22] Filed: Jun. 7, 1995

Related U.S. Application Data

[63] Continuation-in-part of Ser. No. 311,671, Sep. 23, 1994, Pat. No. 5,500,524, and Ser. No. 248,517, May 24, 1994, Pat. No. 5,459,932.

[51] Int. Cl.$^6$ ............................................. G01B 11/26
[52] U.S. Cl. ........................... 356/138; 356/149; 356/250; 33/286; 359/636
[58] Field of Search ..................... 250/216, 559.3, 250/559.29; 356/138, 139.1, 152.2, 148, 149, 375, 248, 250, 153; 33/281, 282, 285, 286; 359/626, 627, 628, 636

[56] References Cited

U.S. PATENT DOCUMENTS

| | | | |
|---|---|---|---|
| 2,460,836 | 2/1949 | Lovins | 88/1 |
| 3,684,381 | 8/1972 | Zoot | 356/138 |
| 3,771,876 | 11/1973 | Ljungdahl et al. | 356/138 |
| 3,807,869 | 4/1974 | Hartley | 33/291 |
| 3,856,409 | 12/1974 | Cindrich et al. | 33/291 |
| 3,897,637 | 8/1975 | Genho | 33/227 |
| 3,936,197 | 2/1976 | Aldrink et al. | 356/250 |
| 4,043,679 | 8/1977 | George et al. | 356/249 |
| 4,062,634 | 12/1977 | Kado et al. | 356/248 |
| 4,111,564 | 9/1978 | Trice, Jr. | 356/247 |
| 4,119,382 | 10/1978 | George et al. | 356/249 |
| 4,183,667 | 1/1980 | Denton | 356/250 |
| 4,221,483 | 9/1980 | Rando | 356/250 |
| 4,252,439 | 3/1981 | Drozella | 356/138 |
| 4,333,242 | 6/1982 | Genho, Sr. | 33/227 |
| 4,448,528 | 5/1984 | McManus | 356/250 |
| 4,679,937 | 7/1987 | Cain et al. | 356/138 |
| 4,767,208 | 8/1988 | Cain et al. | 356/138 |
| 4,781,457 | 11/1988 | Hirano et al. | 356/250 |
| 4,852,265 | 8/1989 | Rando et al. | 33/227 |
| 4,854,704 | 8/1989 | Funazaki et al. | 356/250 |
| 4,912,851 | 4/1990 | Rando et al. | 33/227 |
| 5,012,585 | 5/1991 | Dimaggio | 33/286 |
| 5,075,977 | 12/1991 | Rando | 33/227 |
| 5,108,177 | 4/1992 | Middleton | 356/250 |
| 5,144,486 | 9/1992 | Hart | 359/629 |
| 5,144,487 | 9/1992 | Hersey | 359/629 |
| 5,159,760 | 11/1992 | Speigel et al. | 33/227 |
| 5,182,863 | 2/1993 | Rando | 33/227 |
| 5,184,406 | 2/1993 | Swierski | 33/227 |
| 5,459,932 | 10/1995 | Rando et al. | 33/291 |
| 5,500,524 | 3/1996 | Rando | 250/216 |

FOREIGN PATENT DOCUMENTS

| | | | |
|---|---|---|---|
| 0922508 | 4/1982 | U.S.S.R. | 356/250 |
| 1599654 | 10/1990 | U.S.S.R. | 33/285 |
| 844964 | 8/1960 | United Kingdom | 356/250 |

*Primary Examiner*—Edward P. Westin
*Assistant Examiner*—John R. Lee
*Attorney, Agent, or Firm*—Thomas M. Freiburger

[57] ABSTRACT

Efficient and cost-effective generation of two co-linear laser beams or two or more intersecting beams, for the purpose of alignment as in the construction industry, takes advantage of the unequal divergence of light from a typical laser diode that produces a beam of elliptical cross section. Two roughly equal co-linear beams of light, or two or more intersecting beams, can be generated by reflecting the collimated elliptical beam from preferably two mirror surfaces oriented obliquely to the beam and so as to divide the elliptical beam in two. If one of the reflective surfaces is a beam splitter, three essentially intersecting beams can be generated. In preferred embodiments these three beams are at right angles to each other, particularly for use in construction layout.

15 Claims, 4 Drawing Sheets

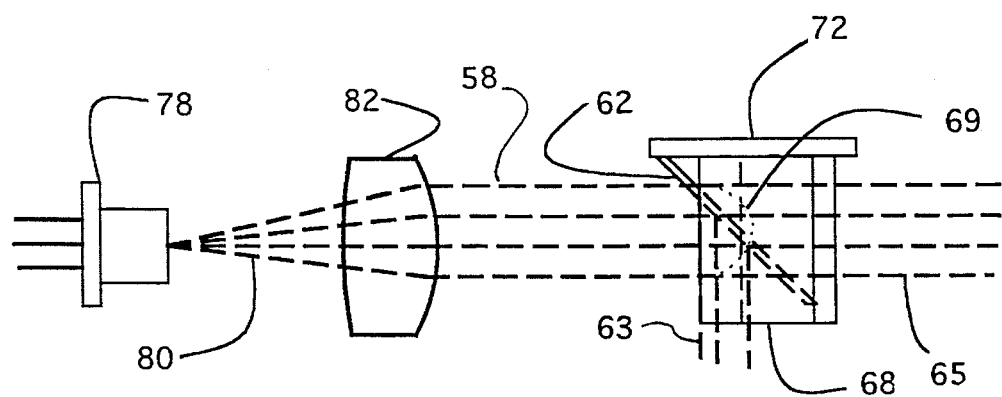
Fig. 6 top view
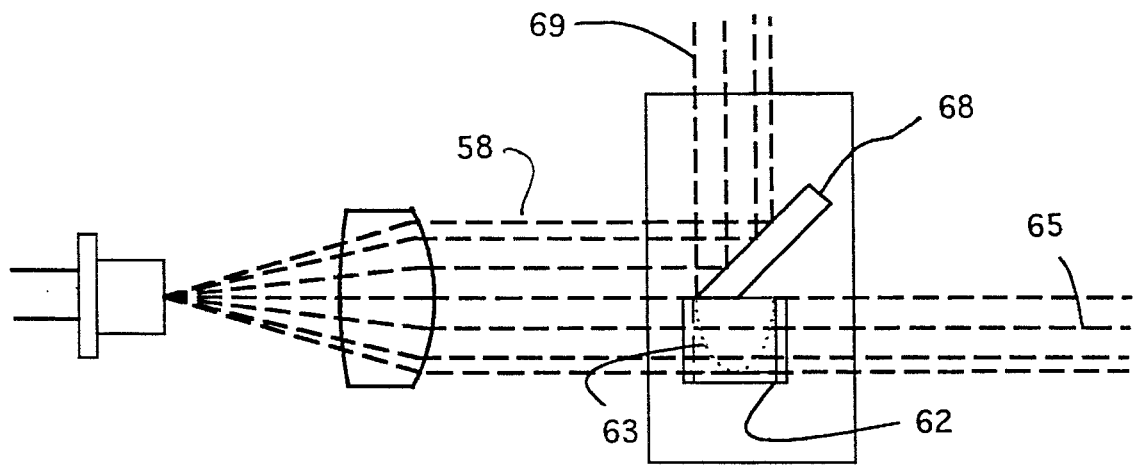
Fig. 7 side view

DIODE LASER CO-LINEAR AND INTERSECTING LIGHT BEAM GENERATOR

This application is a continuation-in-part of application Ser. No. 311,611, filed Sep. 23, 1994, now U.S. Pat. No. 5,500,524 and of application Ser. No. 248,517, filed May 24, 1994, now U.S. Pat. No. 5,459,932.

BACKGROUND OF THE INVENTION

This invention is concerned with laser diodes, and more specifically with the efficient generation of two opposed and substantially co-linear beams from a single laser diode, as well as three intersecting beams from a single laser diode. The invention is also concerned with such beam generation in a self-leveling laser instrument of the type disclosed in application Ser. No. 248,517 referenced above, and that disclosure is incorporated herein by reference (now U.S. Pat. No. 5,459,932).

Compact battery-operated laser projectors are used in the construction industry for alignment purposes. The visible beam of light projects a straight line in space which can be used to locate building references. A leveled or plumb beam of light can be used to set the level or plumb directions of building elements such as floors, walls and columns. In many applications a small-diameter visible laser beam replaces a string line. The beam strikes an object producing a small spot of light. The center of the spot may be marked with a pencil as needed. Two co-linear beams are often desired to produce two spots of light which are the end points of a straight line; two or three intersecting beams are often needed for other applications. In a typical application replacing a plumb bob, a spot of light on the floor is located directly below a spot on the ceiling. For example, in U.S. Pat. No. 5,144,487 two co-linear beams are generated using a beam splitter and a mirror, as are three intersecting beams.

In construction alignment it is desirable to have two intersecting laser beams at 90° to each other or in some cases to have three intersecting beams at 90° to each other. In a typical application, one of the three beams can be used as a plumb reference up or down while the other two beams are level reference beams. In U.S. Pat. No. 5,144,487, referenced above, multiple beams are produced using beam splitters which do not satisfy the intersection condition. An offset between the horizontal and vertical beams results which is a handicap to the user. In addition, the method for generating multiple intersecting beams is less efficient than that of the present invention.

Other methods of using a beam splitter and subsequent mirrors and glass plates are straightforward but cumbersome. The present invention offers a more compact and efficient design which has lower manufacturing cost.

SUMMARY OF THE INVENTION

Generally, visible laser diodes have a much wider divergence in the direction perpendicular to the junction than that parallel to the junction. Typical values are 35° in one axis and 10° in the other. Normally, the center portion of the beam is apertured to produce a beam which is nearly round, cropping out a portion of the beam's power. If other beams are required, a beam splitter and subsequent optic are used to manipulate the newly created beam. The invention uses the elliptical shape of the collimated beam to generate two or more beams of light by splitting the energy spatially instead of by cropping and partial reflection. To achieve two co-linear beams, the included angle between the two mirror surfaces must be substantially 90°. At the same time, rays within the incoming beam must be substantially parallel. In addition, to avoid any offset of the two co-linear beams at the mirrors, the vertex of the mirrors must be at the center of the incoming beam.

A benefit of the invention, relative to generating two co-linear beams, is the ease of manufacture of the precise 90° mirror element. Such an element can be economically manufactured by several low-cost methods. It can be ground as a glass porro prism or injection molded in plastic. A subsequent reflective coating is then required. It can also be replicated using conventional techniques or formed by gluing two mirrors to a substrate while holding them precisely at 90° to each other. Optical replication is a well-known optical manufacturing process in which a master optic is first coated with a soft release layer and then a hard optically reflecting layer. An aluminum or glass surface is then cemented to the master with epoxy. Finally, the aluminum or glass replica is created by pulling the parts apart at the release layer. This process can be used to form the 90° mirrors.

Machining the 90° mirror with a diamond tool (or other very hard machining tool) from an aluminum (or other metal) substrate is an attractive method of manufacture because the 90° angle and reflective surface can be obtained in one operation, with a single machine setup.

When the co-linear beam generator is placed on a self-leveling platform, a co-linear plumb beam directed up and down can be produced simultaneously. Likewise, when such a co-linear beam generator is placed in a horizontal orientation, two level co-linear beams are produced.

In some applications it may be necessary to project more power in one beam than in the other. This can be accomplished by placing the vertex of the mirrors closer to one edge of the beam. The resulting offset of the beam can be compensated for by using a glass plate which shifts the beam according to the glass thickness and index.

Knife edge diffraction at each mirror produces a small deviation of the beam, this effect being known in the art. The deviation is readily corrected by a slight adjustment of the 90° angle (depending on the beam's wavelength and diameter). A slight adjustment of focus can also be used to produce the slight correction required as a result of diffraction, by adjusting the distance between the laser diode and the collimating lens.

The spatial distribution of the elliptical diode laser beam can be used to generate three intersecting beams by employing two reflecting surfaces and orienting one of the reflecting surfaces to reflect a beam out of the plan of the other beam. When one of the two reflecting surfaces is a beam splitter, two beams are formed, thus producing a total of three beams. This can be accomplished using several different orientations of the two reflecting surfaces.

DESCRIPTION OF THE DRAWINGS

The accompanying drawings, which are incorporated in and constitute part of the specification, schematically illustrate a preferred embodiment of the invention and, together with the general description given above and the detailed description of the preferred embodiment given below, serve to explain the principles of the invention.

FIG. 6 is a top view of the system of FIG. 5.

FIG. 7 is a side view of the system of FIG. 5.

DESCRIPTION OF PREFERRED EMBODIMENTS

Figure 1:
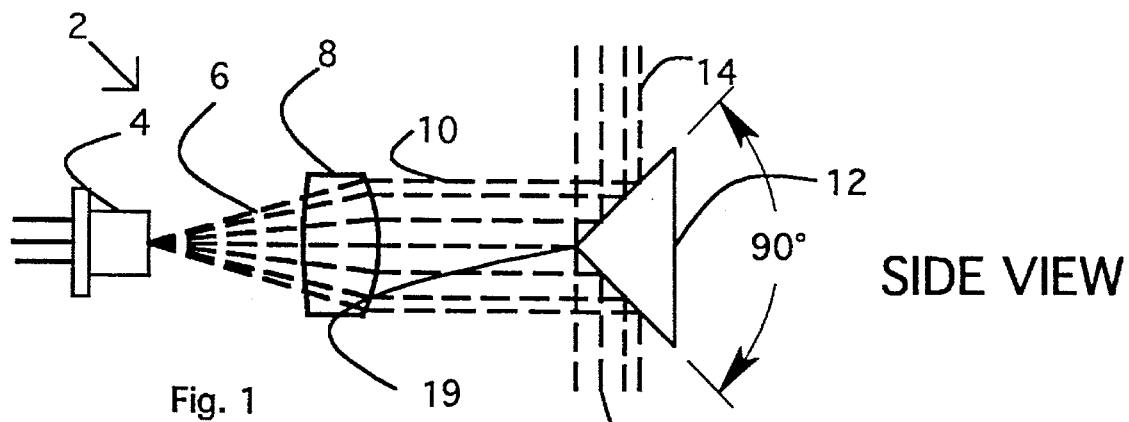
FIG. 1 schematically illustrates the general view of the invention viewed in the horizontal direction with the beams directed vertically up and down.

Referring now to the drawings, a preferred embodiment 2 is shown in FIG. 1. A laser diode 4 produces a diverging beam of light 6 which is collimated by a lens 8 into a parallel beam of light 10. The beam 10 strikes a 90° reflector 12 producing an upwardly directed beam 14 and a downwardly directed beam 18. Because the incoming beam is parallel and the included angle between the mirror surfaces is 90°, the reflected beams will be substantially parallel to each other. Note that precise 45° orientation of the reflector faces with the oncoming beam is not critical. Co-linearity of the resulting beams can be achieved by the placement of the 90° corner or vertex 19 in the beam 10, equally dividing the beam.

The elliptical shape of the diode beam, with different divergence rates on the two perpendicular axes, enables two roughly equal parallel beams to be created by the reflection.

The 90° reflector can be made by coating a glass porro prism or a plastic injection molded porro prism. It can also be made by replication or gluing mirror segments to each other or a substrate. The mounting platform for these three optical elements is not shown and must hold the lens and diode in alignment during the life of the instrument. The drive electronics for the laser diode are also not shown and are well understood.

Figure 2:
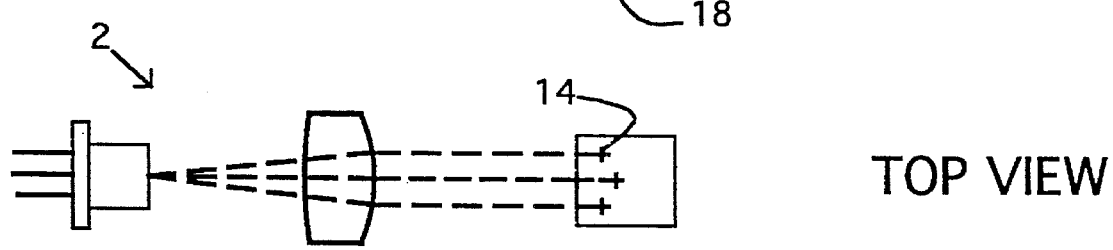
FIG. 2 shows the optical arrangement of FIG. 1 as viewed from above.

FIG. 2 shows the same elements of FIG. 1 viewed from above. The upwardly directed beam 14 is viewed on end. Note the difference in divergence of the beam from the laser diode, on two different perpendicular axes, as seen in side and top views. FIG. 1 shows a long dimension of the beam, while FIG. 2 shows its short dimension.

Figure 3:
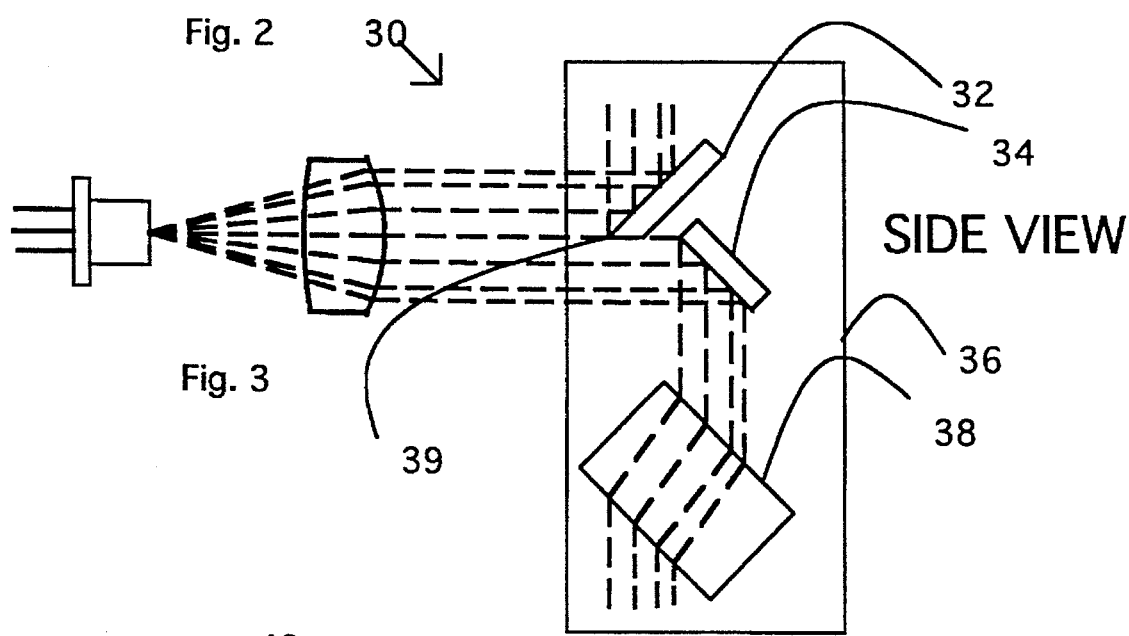
FIG. 3 is an alternate embodiment of the invention in which the mirrors are separate and offset, with the offset being corrected using a glass plate.

FIG. 3 shows another preferred embodiment 30 in which a mirror 32 and a mirror 34 provide the reflection. The edge of mirror 32 is bevelled to allow the mirrors to be closer together to avoid power loss in the beam. The included angle between the reflecting surfaces is substantially 90°. These mirrors are fastened to a substrate 36. A substantially parallel glass plate 38 (i.e. having two essentially parallel surfaces) is required to correct for the offset caused by the offset mirror locations. The plate can also be fastened to the substrate 36. The offset can be adjusted by tilting the plate relative to the beam, and such an adjustment may be useful in manufacturing. All or some of the elements may be glued to a substrate 36 for ease of manufacture. As discussed above, greater beam power can be generated in one of the emerging oppositely-directed beams than the other by positioning the vertex 39 (19 in FIG. 1) of the two reflective surfaces such that the long dimension of the beam is divided unequally. This will create a slight offset of the two beams, but the offset is easily corrected with the apparatus of FIG. 3, whether or not the reflecting surfaces are offset as in FIG. 3.

Figure 4:
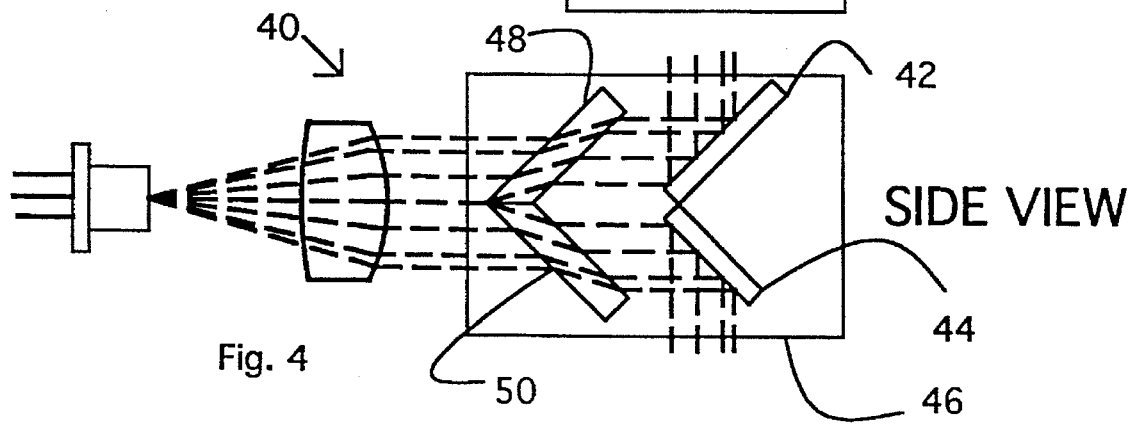
FIG. 4 is an alternate embodiment of the invention in which the offset is avoided by using two glass plates ahead of the reflecting surfaces.

FIG. 4 shows another preferred embodiment 40 in which mirrors 42 and 44 provide the reflection. The included angle between the two reflecting surfaces is substantially 90°. The mirrors are fastened to a substrate 46. Bevelled substantially parallel glass plates 48 and 50 are provided to avoid beam offset and loss from the beam. Again, for specific applications beam power can be divided unequally between the two emerging co-linear beams. Resulting offset can be corrected using the parallel-surfaced glass plates 48, 50 by rotating them or manipulating each individually, prior to adhering or otherwise fastening these glass plates to the substrate 46.

Figure 5:
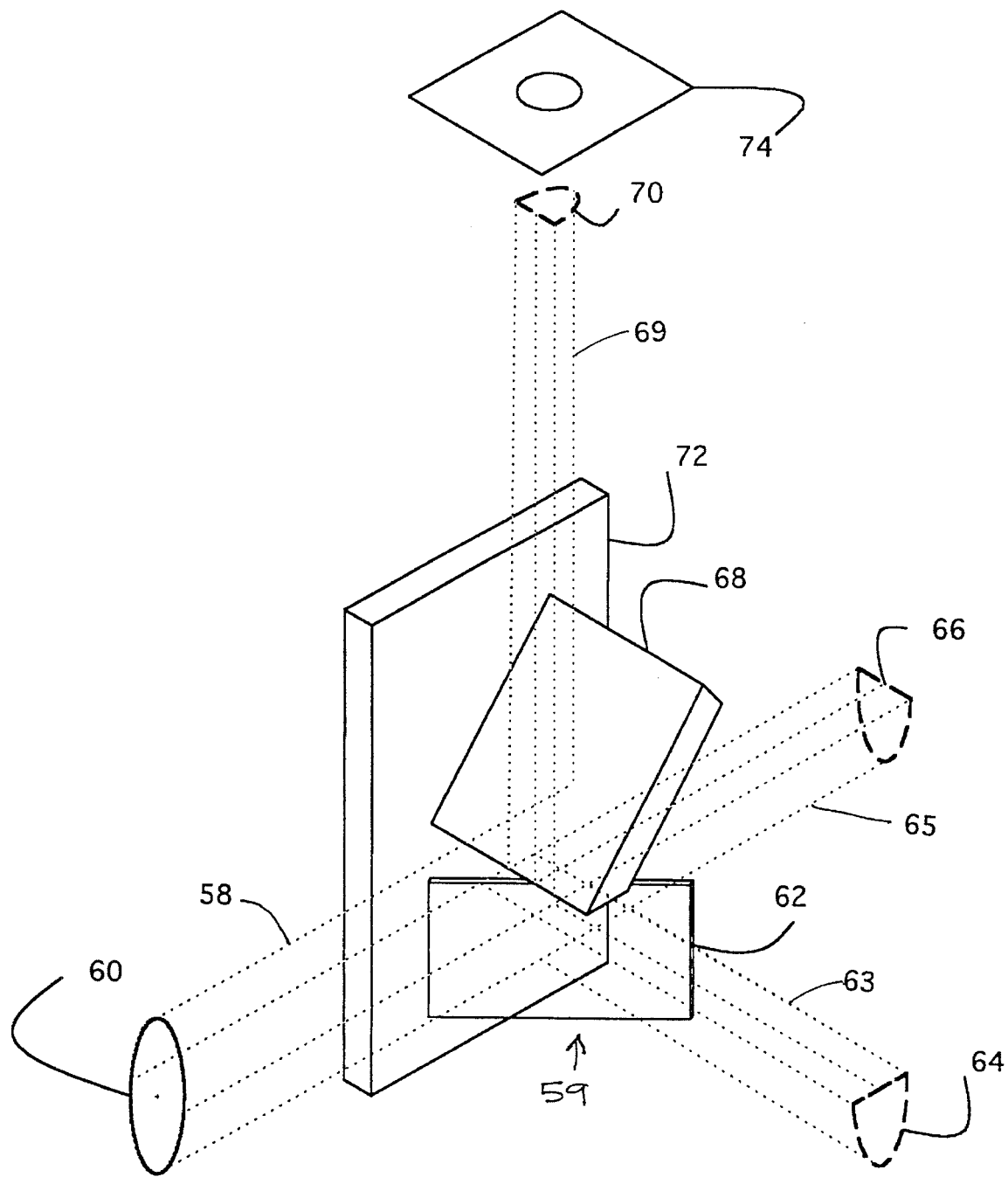
FIG. 5 is a schematic perspective view showing an alternate embodiment of the invention in which three intersecting beams are created using a mirror at 45° to the incoming beam producing a plumb beam while a beam splitter at 45° to the incoming beam at a different plane produces two level beams at 90° to each other and to the plumb beam.

In FIG. 5, a collimated beam 58 from a laser diode is directed toward an optical system 59 of the invention. The beam perimeter is designated as 60. A mirror 68, angled obliquely to the incoming beam 59, reflects a section 69 of the beam whose perimeter is shown at 70. A beam splitter 62, also angled obliquely to the beam, reflects a portion 63 of the beam whose perimeter is indicated at 64. The perimeter of the transmitted portion 65 of the beam is designated as 66. The mirror 68 and beam splitter 62 are cemented to a substrate or frame member 72. A mask 74 may be used to circularize the plumb beam if desired. A similar mask could be used on the other beams if desired. The location of the mask may be used to finely position the center of the projected beam for application where high accuracy is required.

In the preferred embodiment illustrated, the reflecting surfaces 62 and 68 are at 45° to the incoming beam 58, to generate three orthogonal, mutually right-angled beams as shown. However, it is possible to generate two or three (or more) intersecting beams (including co-linear) which are otherwise angularly related, for specific desired purposes.

There is a small offset of the transmitted beam 65 from the reflected beam 69 due to the finite thickness of the beam splitter 62. This offset can be neglected in most applications or it can be minimized by using a thin beam splitter. The exact position of the mirror 68 relative to the beam splitter 62 effects the point of intersection of the three beams.

FIG. 6, a top view, and FIG. 7, a side view, are intended to clarify the method and system of generating the three beams in a preferred embodiment. A beam 80 from a laser diode 78 is collimated by a lens 82, producing the beam 58. The mirror 68 reflects a portion of the beam in the plumb direction, creating beam 69 (shown in dotted lines, end view, in FIG. 6). The beam splitter 62 creates the horizontal beam 63 (shown in dotted lines, end view, in FIG. 7), while the beam 65 is a transmitted beam.

It should be understood that the arrangement of reflecting surfaces/beam splitter shown in FIGS. 5–7 is only one of several possible arrangements which will be apparent to those skilled in the art for achieving the purposes of the invention, which purposes include generation of multiple beams in an efficient manner from a laser diode beam which is naturally non-circular in cross section. As an example, the apparatus shown in FIGS. 1–4 could also be used to produce a third beam, if one of the reflecting surfaces shown in FIGS.

1–4 is a beam splitter. The three intersecting beams thus produced will not be subject to offset due to the use of a beam splitter, but all three beams will lie in a common plane, which differs from the three right-angled intersecting beams generated by the arrangement shown in FIGS. 5–7. For purposes of this description and the claims, the term "intersecting" as applied to beams generated by systems of the invention is intended to include co-linear beams propagating in opposite directions, as well as other beams with angular relationships to each other.

It is also possible under the principles of the invention to simply produce two intersecting beams by positioning a mirror obliquely to the incoming beam (preferably 45°), such that the mirror reflects only part of the beam, dividing the elliptical beam through its long axis as in the embodiment described. The remainder of the incoming beam then continues on the same path, thus producing two intersecting beams. This can be envisioned from FIG. 3, if one of the two reflectors 32 and 34 were removed. Such an arrangement is an efficient alternative to a beam splitter and can take advantage of the natural ellipticity of the beam to produce two beams of greater power than the case where an elliptical beam is apertured, cropping out considerable beam power.

Figure 8:
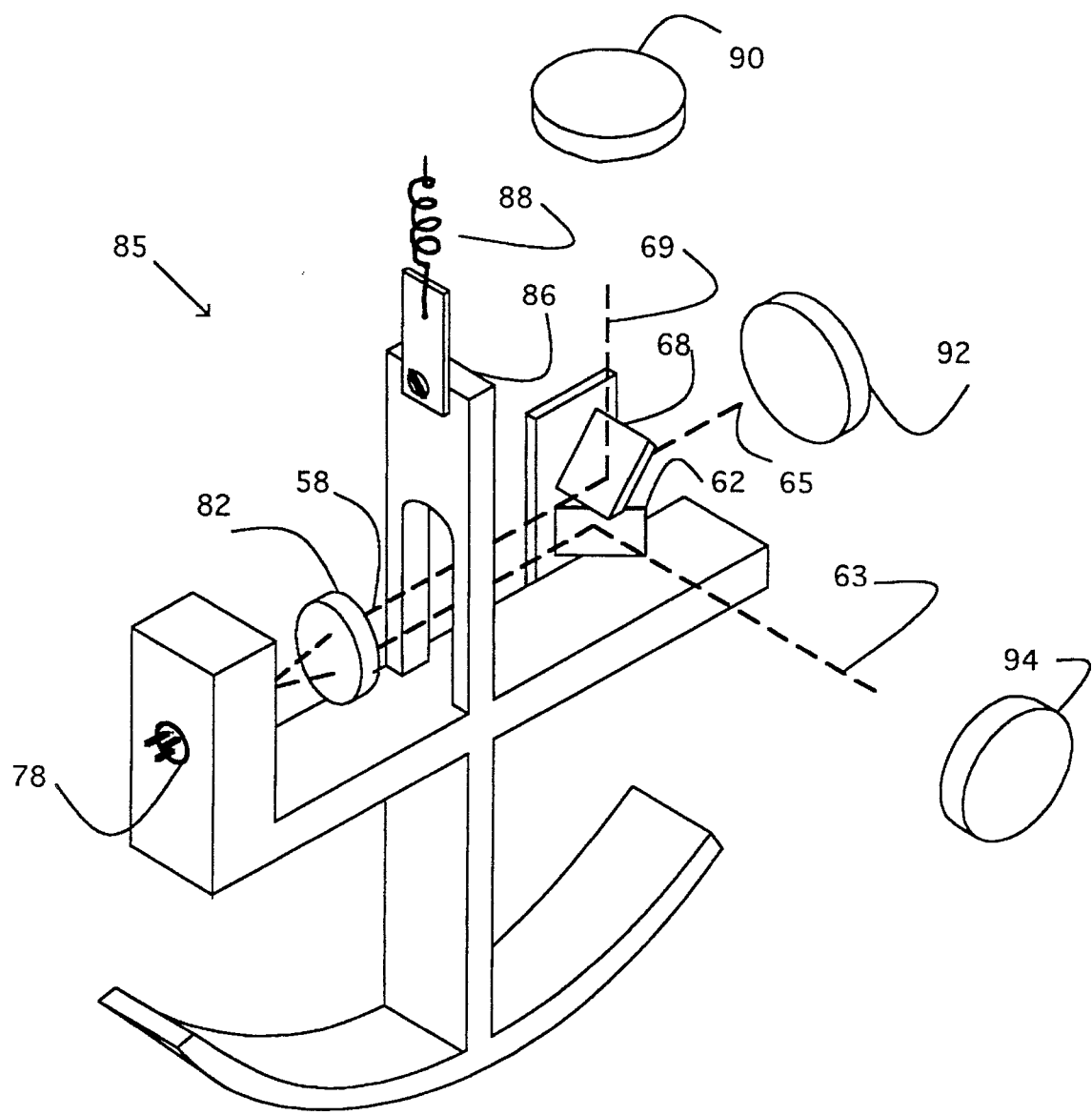
FIG. 8 is a perspective view showing a beam generating system of the invention on a self-leveling pendulum, as part of a self-leveling laser tool.

FIG. 8 shows schematically a pendulum or pendulous mount 85 of the type which is shown in several embodiments of copending application Ser. No. 248,517, now U.S. Pat. No. 5,459,932 whose disclosure is incorporated herein by reference. FIG. 8 shows incorporation of the multiple beam generating system described above and shown in FIGS. 5–7 in a self-leveling tool such as disclosed in the referenced copending application. A pendulum 86, supported at least in part by a spring 88 supports the laser diode 78 and the collimating lens 82, as in the preferred embodiment illustrated in FIGS. 6 and 7. The collimated but elliptical or oblong beam 58 reflects off surfaces of the two reflectors 68 and 62. Since the reflector 62 is a beam splitter, this produces three intersecting beams 63, 65 and 69 which are preferably, and in accordance with the purposes of a survey or construction layout tool, at right angles to each other. Thus, a self-leveling tool according to the invention can produce two horizontal beams and one plumb beam, all of which are accurate to within a very small angle due to the self-leveling nature of the tool, as described in copending application Ser. No. 248,517 (U.S. Pat. No. 5,459,932).

Three beam exit windows are also shown in FIG. 8, a plumb window 90 and two horizontal exit windows 92 and 94. As disclosed in the referenced copending application, these windows can comprise weak negative lenses or weak reverse telescopes, in the disclosed embodiments wherein the pendulous mount does not fully correct the beams to true level and plumb (e.g. FIGS. 7A, 7B, 19). Alternatively, these elements can simply be exit windows, without any correction, if the pendulous mount employs two-stage mechanical tilt correction as in other disclosed embodiments of the referenced copending application (e.g. FIG. 15–16).

Many modifications to the preferred embodiment will be apparent to those of ordinary skill in the art but which will still embody the invention. Therefore, the invention is not intended to be limited by the scope of the detailed description of the drawings, but by the claims which follow.

I claim:

1. A method for producing a plurality of essentially intersecting light beams from a single laser diode source, comprising:

providing a laser diode source to produce a beam which diverges at two substantially different rates on two perpendicular beam axes, collimating the laser diode beam to produce a substantially collimated beam of different dimensions on the two beam axes, the collimated beam having a greater dimension on a long axis and a smaller dimension on a short axis, and positioning in the path of the substantially collimated beam two reflective surfaces both at oblique angles to the path of the beam, and orienting the two reflective surfaces to divide the substantially collimated beam through its greater dimension to reflect the beam and produce two beams of light directed in different directions from the single beam.

2. The method of claim 1, wherein one of the reflective surfaces comprises a beam splitter having transmission sufficient to produce a transmitted beam, so that three intersecting light beams are produced.

3. The method of claim 2, wherein said one reflective surface comprising a beam splitter is positioned essentially at 45° to the path of the substantially collimated beam, producing a first beam substantially at right angles to the path of the substantially collimated beam and a second beam which is essentially co-linear with the substantially collimated beam, and wherein another of the two reflective surfaces is positioned substantially at 45° to a plane containing the substantially collimated beam and said first and second beams, thereby to produce a third beam perpendicular to the first and second beams.

4. The method of claim 2, including positioning the reflecting surfaces to produce two essentially horizontal beams and an essentially plumb beam, all substantially at right angles to one another.

5. The method of claim 4, further including placing the laser diode source and the two reflective surfaces within a portable hand tool, on a pendulous mounting means secured to a housing of the portable hand tool and depending internally in the housing, for correcting for substantially all tilt of the housing when the housing is not truly level or plumb.

6. The method of claim 5, including providing the pendulous mounting means as a first stage tilt alignment mounting means for enabling the pendulum to pivot relative to the housing to a suspended position which corrects for nearly all tilt of the housing and a second stage tilt alignment mounting means secured to the first tilt alignment mounting means for further correcting the depending position of the pendulum to more nearly level or plumb orientation of the laser beam.

7. The method of claim 4, including placing the laser diode source and the two reflective surfaces within a portable hand tool having a housing, on a pendulous mounting means secured to the housing and depending internally in the housing, including a platform, for effecting a first stage of alignment when the housing is not truly level or plumb, by tilting the platform angularly relative to the housing as induced by tilt of the housing, the laser diode source being mounted on the platform of the pendulous mounting means such that the projected primary beam from the laser means changes in angular relationship to the housing and is aligned to nearly level or plumb orientation when the housing is tilted, leaving a small angle of deviation of the primary laser beam from such truly level or plumb orientation, and the portable hand tool including a weak lens means secured to the housing and positioned in the path of the primary laser beam, in a second stage of alignment, having a position and optics selected for aligning the laser beam to truly level or plumb orientation as a final laser beam, by bending the path of the primary laser beam by said small angle of deviation.

8. A method for producing a plurality of essentially intersecting light beams from a single laser diode source, comprising:

providing a laser diode source to produce a beam which diverges at two substantially different rates on two perpendicular beam axes, collimating the laser diode beam to produce a substantially collimated beam of different dimensions on the two beam axes, the collimated beam having a greater dimension on a long axis and a smaller dimension on a short axis, and positioning in the path of the substantially collimated beam a reflective surface at an oblique angle to the path of the beam, and orienting the reflective surface with an edge of the reflective surface positioned to divide the substantially collimated beam through its greater dimension to reflect only a portion of the beam and to direct said portion of the beam to a different direction, thereby producing two beams of light directed in different directions from the single beam.

9. The method of claim 8, further including positioning a second reflective surface in the path of the substantially collimated beam at an oblique angle to the substantially collimated beam, the second reflective surface being positioned to reflect substantially a remaining portion of the beam in a direction different from that of the substantially collimated beam and from the other reflected beam portion.

10. The method of claim 9, wherein in the second reflective surface comprises a beam splitter having transmission sufficient to produce a transmitted beam, so that three intersecting light beams are produced.

11. A system producing a plurality of essentially intersecting light beams, comprising:

a diode laser source providing a beam which diverges at two substantially different rates on two perpendicular beam axes, lens means for converting the diverging beam into a substantially collimated beam of substantially different dimensions on the two axes, a greater dimension on a long axis and a smaller dimension on a short axis, at least one reflective surface positioned in the path of the substantially collimated beam obliquely to the path of the beam, said reflective surface having an edge which is positioned to divide the substantially collimated beam through its greater dimension to reflect only a portion of the beam from the reflective surface, thereby producing two beams of light, in different directions.

12. The system of claim 11, including a second reflective surface positioned obliquely in the path of the substantially collimated laser beam, to receive essentially a remaining portion of the substantially collimated beam, whereby two beams of light are produced both in different directions from the substantially collimated beam.

13. The system of claim 12, wherein one of the reflective surfaces comprises a beam splitter having transmission sufficient to produce a transmitted beam, so that three intersecting light beams are produced.

14. The system of claim 13, wherein said reflective surface comprising a beam splitter is positioned essentially at 45° to the path of the substantially collimated beam, producing a first beam substantially at right angles to the path of the substantially collimated beam and a second beam which is essentially co-linear with the substantially collimated beam, and wherein the other of the two reflective surfaces is positioned substantially at 45° to a plane containing the substantially collimated beam and said first and second beams, thereby to produce a third beam perpendicular to the first and second beams.

15. The system of claim 14, in combination with a self-leveling portable hand tool, for projecting laser beams in level and plumb directions, said third beam being an essentially plumb beam, the portable hand tool including a housing and pendulous mounting means for correcting for a tilted condition of the housing, secured to the housing and depending internally in the housing, said diode laser source, lens means and reflective surfaces being mounted on the pendulous mounting means.

* * * * *